United States Patent [19]

Ball et al.

[11] Patent Number: 4,616,136
[45] Date of Patent: Oct. 7, 1986

[54] INFRA-RED RADIATION DETECTOR

[75] Inventors: Patrick J. R. Ball; Geoffrey Baker; Martin Renals, all of Southampton, England

[73] Assignee: U.S Philips Corporation, New York, N.Y.

[21] Appl. No.: 671,149

[22] Filed: Nov. 13, 1984

[30] Foreign Application Priority Data

Dec. 2, 1983 [GB] United Kingdom ............... 8332264

[51] Int. Cl.$^4$ .............................................. G01J 5/10
[52] U.S. Cl. ...................................... 250/338; 250/349
[58] Field of Search ................. 250/338 PY, 349, 342

[56] References Cited

U.S. PATENT DOCUMENTS 4,441,023 4/1984 Doctor et al. ...................... 250/349
4,489,238 12/1984 Baker ................................. 250/349
4,556,796 12/1985 Renals ........................... 250/338 PY

FOREIGN PATENT DOCUMENTS 1504283 3/1978 United Kingdom .
1580403 12/1980 United Kingdom .
2125214 2/1984 United Kingdom .

OTHER PUBLICATIONS

Rose, M. A. "Pyroelectric Infrared Detectors." Electronic Components and Applications, vol. 4, No. 3, pp. 142-149 (May 1982).

Primary Examiner—Carolyn E. Fields
Attorney, Agent, or Firm—Marc. D. Schechter

[57] ABSTRACT

A pyroelectric infrared radiation detector which is particularly suited to automated assembly comprises a pyroelectric detector element mounted in a housing having a window transparent to infrared radiation. Electrically conductive leads in a single-in-line configuration extend through a base portion of the housing for making external electrical connections to the detector. One lead has an extended portion within the housing. The extended portion provides a cantilever support to which the detector element is fastened. The leads may all be formed from portions of a unitary lead frame. A second differentially connected pyroelectric detector element may be fastened to another cantilever support formed by a portion of the same lead frame. The cantilever supports preferably extend from an insulating block which encapsulates an associated electrical component and which also provides support for the detector elements.

18 Claims, 6 Drawing Figures

INFRA-RED RADIATION DETECTOR

BACKGROUND OF THE INVENTION

This invention relates to an infrared radiation detector comprising a pyroelectric detector element mounted in a housing. The housing has a window transparent to infrared radiation. Electrically conductive leads extend through a portion of the housing for making external electrical connections to the detector. One of the leads is electrically connected to said detector element.

Infrared radiation detectors comprising pyroelectric detector elements may be used for a variety of purposes. For example, they may be used in remote switching systems, in intruder alarms, and in movement sensors generally. Such sensors rely on the fact that a human being naturally provides a moving source of infrared radiation as he walks about or even as he moves only part of his body, for example by waving his hand. The radiation which he emits is converted by the pyroelectric detector into an electric signal which can be used, for example, to actuate an alarm or to switch lights on or off.

The pyroelectric detector element is generally mounted in a housing to shield it from environmental influences. A rugged but inexpensive detector is disclosed in Mullard Technical Publication M82-0069 entitled "Pyroelectric infrared detectors" by M. A. Rose (*Electronic Components and Applications,* Vol. 4, No. 3, pages 142–149, May 1982). In this detector, the housing is a metal can having a standard T0.5 outline.

A similar housing is also shown and described in British patent application GB Pat. No. 2,102,200. In this application, the can comprises separate base and cover portions. The base portion provides a mounting platform within the housing. The cover portion comprises a window transparent to infrared radiation. Three leads extend outward from the base portion for making external electrical connections to the detector. Two of these leads extend through the base to provide two terminals in the form of short posts. The posts protrude above the mounting platform inside the housing. The third lead is electrically connected to the mounting platform.

As described in GB Pat. No. 2,102,200, the detector comprises two differentially connected discrete pyroelectric detector elements mounted in the housing. In order to thermally isolate the detector elements from the housing (and hence from the environment) they are spaced from the mounting platform of the base. The detector elements are each supported, respectively, by two electrically conductive leads of an upturned microminiature package.

The microminiature package is a small block of plastic material encapsulating a field effect transistor and possibly other electrical components (for example, a pair of parallel-opposed low leakage diodes producing a gate leakage path for the field effect transistor). The two conductive leads of the microminiature package which are connected, respectively, to the source and drain of the field effect transistor are electrically connected respectively, to two of the external detector leads. The connections are made by metal straps or wires extending from the leads of the microminiature package to the two terminal posts of the base. One of the detector elements is electrically connected to the third external detector lead via the mounting platform, and the two detector elements are interconnected by a metal strap or wire.

The infrared detector of GB Pat. No. 2,102,200 has the important advantage over previous detectors that it is more straightforward to manufacture. This is because the number of wire bonds for connecting the detector elements and associated circuitry to the terminal leads is significantly reduced. However, with the T05 housing, detectors must be assembled on individually. Also, the construction and arrangement of the detector remains relatively complex so that manufacture is not only time consuming, and hence expensive but is also difficult to mechanize.

Another disadvantage is that the terminal leads are arranged in a triangular configuration. Such a configuration is inconvenient for automatic testing because it is difficult to make satisfactory temporary electrical connections to them. While these shortcomings can be accommodated in relatively low volume production, they are not conducive to the high volume production.

SUMMARY OF THE INVENTION

According to the present invention, an infrared radiation detector comprises a terminal lead having an end which extends into the housing which provides a cantilever support for the detector element.

An infrared radiation detector according to the invention has the advantage of having only few component parts and a relatively straightforward construction. It lends itself readily to mechanized assembly because one of the leads serves not only as an external connection for the detector but also as a cantilever support to which the detector element is fastened.

Preferably the leads are flat and substantially coplanar. This is more convenient for automatic testing because it enables temporary electrical connections to be made to the detector more easily. Moreover, the leads can then be formed by portions of a unitary lead frame, in which case detector assembly can be highly automated.

For optimum isolation of the pyroelectric detector element from the housing, it is preferable that the lead to which the detector element is fastened comprises a raised portion against which the detector element bears. In this way, the major part of the detector element can be maintained spaced from the lead.

Part of the conductive leads may be embedded in a block of insulating material in the housing. In this case, the detector element may also bear against the insulating block for support. In one example, the block can be provided with a recess in which the detector element is supported.

In a preferred embodiment, a second pyroelectric detector element is electrically connected to an electrically conductive member which is substantially coplanar with the leads. The conductive member, which may be a portion of the unitary lead frame, is partially embedded in the block of insulating material but extends therefrom to form a second cantilever support for the second pyroelectric detector element.

For optimum isolation of the second detector element from the housing, the conductive member may comprise a raised portion against which the second detector element bears. In this way the major part of second detector element can be spaced from the conductive member.

The second detector element may also bear against the block of insulating material and may be supported in the same recess as the other detector element. Indeed both pyroelectric detector elements may be formed in a single body of pyroelectric material.

An infrared radiation detector in accordance with the invention may comprise an electrical component, for example an impedance converting amplifier, which is connected electrically to the conductive member. The electrical component, which may actually be fastened to the conductive member, is also embedded in the block of insulating material and may therefore be an unencapsulated semiconductor device. This offers the advantage of circuit design flexibility because other unencapsulated semiconductor devices may also be included in the detector. The individual components and their interconnections can all be embedded in the same insulating block. Thus, in a detector according to the invention, the block of insulating material can be used to encapsulate the electrical components while also supporting the pyroelectric elements.

DESCRIPTION OF THE PREFERRED EMBODIMENTS

It is noted that for the sake of clarity the drawings are not to scale, particularly in the thickness direction.

Figure 1:
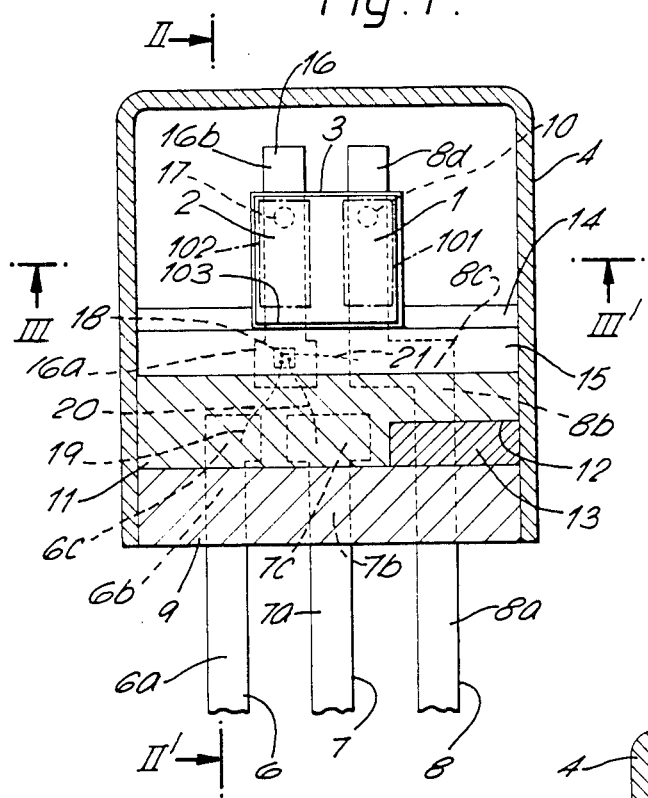
FIG. 1 is a cross section of an infrared radiation detector according to the invention.
Figure 2:
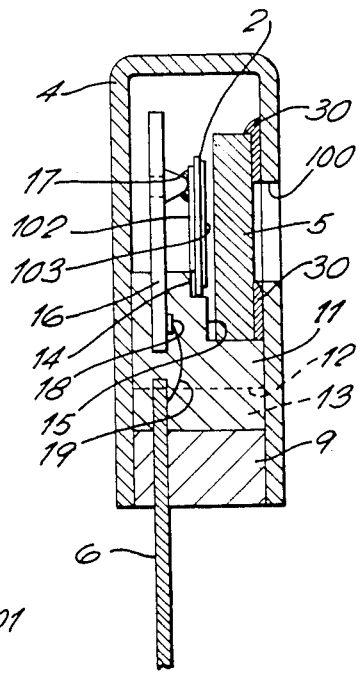
FIG. 2 is a cross section along the line II—II' of the detector of FIG. 1.
Figure 3:
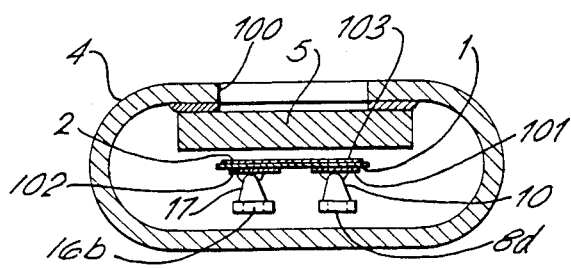
FIG. 3 is a cross section along the line III—III' of the detector of FIG. 1.

The infrared radiation detector shown in FIGS. 1, 2, and 3 comprises two pyroelectric detector elements 1 and 2. The detector elements are formed in a common body 3 of uniformly poled pyroelectric ceramic material such as lanthanum and manganese doped lead zirconate titanate. For more information about this particular material see United Kingdom Patent GB No. 1,504,283.

The pyroelectric body 3 may be 3.4 mm square and approximately 70 microns thick. The detector elements are defined by two separate electrodes 101 and 102 on the lower surface of body 3, and a single common electrode 103 on the upper surface.

The detector elements 1 and 2 are thus connected in series opposition. As is well known, such a connection provides immunity from common mode signals such as those generated by variations in ambient temperature, background radiation, and acoustic noise.

In FIG. 1, the outlines of lower electrodes 101 and 102 are shown as dot-and-dash lines. The electrodes 101 and 102, may be made of nichrome provided in sufficient thickness to be reflective to infrared radiation of a wavelength at which the detector is responsive. The electrode 103 may be made of a thinner layer of nichrome which is transparent to infrared radiation. Electrode 103 covers substantially the whole upper surface of the body 3. However, for the sake of clarity, the electrode 103 is shown slightly inset from the edges of the pyroelectric body 3. The electrodes 101 and 102 are each approximately 2.5 mm×1 mm and are spaced apart by approximately 1 mm. The outer edges of electrodes 101 and 102 are slightly inset from the edges of upper electrode 103.

The pyroelectric detector elements 1 and 2 are mounted in a housing comprising a cover 4 made of metal, such as nickel or nickel plated steel. Alternatively, the cover 4 may be made of plastic which is metallized on the inside walls. The metal or metallization allows the detector elements to be electrically screened and provides improved hermeticity.

The cover 4, which may be approximately 10.5 mm tall, 9.4 mm wide and 3.0 mm deep, has substantially flat front, back and top faces. The side faces are rounded (see FIG. 3) and have a radius of curvature of, for example, 3 mm. At the top end (i.e. where the top face meets the front, back and side faces), the edges and corners of the cover 4 are rounded, (see FIGS. 1 and 2). At the bottom end, the cover 4 is open.

The front surface of the cover is provided with a rectangular aperture 100 measuring approximately 2.5×3.5 mm. A rectangular silicon window 5, measuring approximately 4.5×5.5 mm and 1 mm thick, is fastened with a conductive epoxy adhesive 30 to the inside of the cover 4 over the aperture. Thus, the window 5 forms part of the electrical screen.

It is noted here that silicon is transparent to infrared radiation and has a substantially flat transmission over the wavelength range from 1 $\mu$m to 15 $\mu$m. However, the silicon may be provided with a known multilayer coating which restricts transmission to the wavelength range from 6 $\mu$m–14 $\mu$m.

The window 5 is located directly in front of the pyroelectric elements 1 and 2. The spacing between the front plane of the window 5 and the front plane of the pyroelectric detector elements 1 and 2 is approximately 0.5 mm. However, because the refractive index of silicon is 3.5, the apparent position of the front plane of the detector elements is moved 0.7 mm toward the window front plane.

Three electrically conductive leads 6, 7 and 8 extend through a 1.5 mm thick base portion 9 of the housing for providing external electrical connections to the detector. The base portion 9 is a sealing resin such as, for example, HYSOL RE 2039 (Trade Mark) resin and HYSOL HD 3561 (Trade Mark) hardener available from Dexter Hysol Ltd. Outside the housing, each of the leads 6,7 and 8 has a leg portion in the form of a flat strip 6a, 7a and 8a respectively. These leg portions 6a, 7a and 8a, which are substantially co-planar may be, for example, 0.8 mm wide, 0.25 mm thick and extend 13 mm outside the housing 4. The spacing between the leg portions may be 2.54 mm.

Lead 6 has a 0.8 mm wide strip portion 6b extending 2 mm from the leg portion 6a into the housing. A 1.4 mm×0.8 mm terminal portion 6c is contiguous with portion 6b and provides a contact area for a wire bond connection (decribed in more detail below). The lead portions 6b and 6c together form an L-shape.

Lead 7 has a 0.8 mm wide strip portion 7b extending 2 mm from the leg portion 7a into the housing. A 2.0 mm×0.8 mm terminal portion 7c is contiguous with portion 7b and provides a contact area for a wire bond connection (described in more detail below). The lead portions 7b and 7c together form a T-shape.

Lead 8 has a 0.8 mm wide strip portion 8b extending 2.5 mm from the leg portion 8a into the housing. A 2.4 mm×1.0 mm portion 8c is contiguous with portion 8b and extends orthogonally therefrom toward the center of the housing. A further lead portion 8d is contiguous with portion 8c and extends orthogonally thereto. Portion 8d, which may be 4 mm long and 1.0 mm wide, is parallel to, but wider than, portion 8b. The lead portion 8d is lies midway between leg portions 7a and 8a.

Lead portion 8d has a centrally disposed bump 10 at its front surface. Bump 10 is formed by providing a dimple at the rear surface of the lead. The dimple may be 0.6 mm in diameter and may be situated 2 mm from the free end of lead portion 8d.

Inside the housing, the leads 6, 7 and 8 are partially embedded in a block 11 of plastic material, such as for example, HYSOL MG15 (Trade Mark) available from Dexter Hysol Ltd. Block 11 is contiguous with the sealing resin base portion 9 and with the front, back and side faces of cover 4. Block 11 and the sealing resin 9 together fully encapsulate the lead portions 6b, 6c, 7b, 7c and 8c.

The block 11 is provided with a recess 12 in one corner at the area where the lead portion 8b enters the sealing resin 9. Thus, a part, for example a 1 mm length, of lead portion 8b, is not embedded in the block 11. The recess 12 is filled with an electrically conductive epoxy 13. Epoxy 13 encapsulates the exposed part of lead portion 8b and contacts the side face of the cover, thereby electrically connecting lead 8 to the metal or metallized plastic cover 4.

Lead portion 8d extends from the block 11 by approximately 3 mm into the housing and forms a cantilever support to which pyroelectric detector element 1 is fastened. The lower electrode 101 of detector element 1 bears against the bump 10 on lead portion 8d and is fastened thereto with a conductive epoxy adhesive. Thus, one end of the detector element 1 is supported by the bump 10 on the lead portion 8d.

At its other end, the detector element bears against the block 11 where it is fixed with a nonconducting epoxy adhesive. The detector element 1 is accommodated in a recess 14 in the block 11 such that the detector element 1 lies substantially parallel to the window 5 and to the front face of the cover 4. For the most part, the detector element 1 is spaced from the conductive lead portion 8d.

An electrically conductive member 16 made of the same material as and coplaner with the conductive leads 6, 7 and 8 extends from block 11 to form a cantilever support to which the detector element 2 is fastened. The conductive member 16 comprises a 1.5 mm×1.0 mm contact area 16a which is wholly embedded in the block 11. A strip portion 16b is contiguous with contact area 16a and extends from the block 11 by approximately 3 mm into the housing. Portion 16b forms the cantilever support for detector element 2. Strip portion 16b is substantially parallel to lead portion 8d and is separated therefrom by approximately 1.0 mm. The strip portion 16b lies midway between leg portions 7a and 8a.

Like lead portion 8d, strip portion 16b has a centrally disposed bump 17 at its front surface. Bump 17 is formed by providing a dimple at the back surface. The dimple may be 0.6 mm in diameter and may be situated 2 mm from the end of strip portion 16b. The lower electrode 102 of detector element 2 bears against the bump 17 and is fastened thereto with a conductive epoxy adhesive.

One end of detector element 2 is supported by the bump 17 and the other end bears against recess 14 in the block 11, such that the detector element 2 lies substantially parallel to the window 5 and to the front apertured face of the cover 4. The detector element 2 is fixed in the recess 14 with nonconducting epoxy adhesive. The recess 14 extends the full width of block 11 so that it is sufficiently wide to accommodate both pyroelectric detector elements 1 and 2. For the most part, the detector element 2 is spaced from the strip portion 16b.

A semiconductor device 18 is fastened to the contact area 16a of member 16 using a conductive epoxy adhesive or a eutectic die bond. Device 18 comprises a field effect transistor T and a pair of parallel opposed diodes $D_1$ and $D_2$ connected to the gate of the transistor. (See FIG. 4.) The semiconductor device may be a single chip, although discrete components may be used instead.

The back face of the chip 18 is the transistor gate contact. The gate contact is thus connected electrically to the lower electrode 102 of the detector element 2. The chip 18 has three contact areas on its front face for the source and drain of the transistor and for the diodes respectively. The source is connected by a wire bond 19 to the contact area 6c of lead 6. The drain is connected by a wire bond 20 to the contact area 7c of lead 7. The diodes are connected by a wire bond 21 to the transverse portion 8c of lead 8. The chip 10 and the wire bonds 19, 20 and 21 are all embedded in the plastic block 11.

Figure 4:
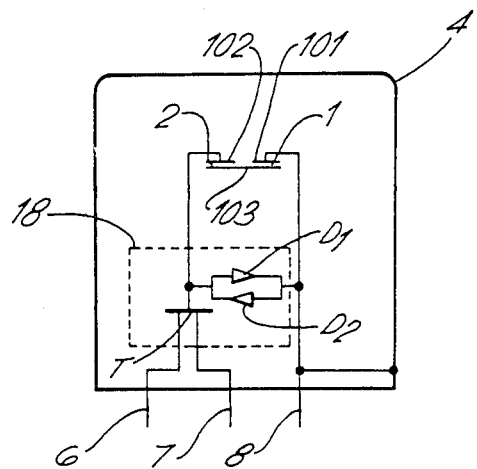
FIG. 4 is an equivalent circuit diagram of the detector in FIGS. 1 to 3.

The circuit thus established is shown in FIG. 4. As usual, the pyroelectric detector elements 1 and 2 are represented as capacitors. The parallel opposed diodes $D_1$ and $D_2$ are included to provide a gate leakage path for the field effect transistor T. For more information about this particular circuit arrangement, see U.K. Pat. No. 1,580,403.

However, it is noted here that a detector according to the invention, has the advantage of circuit design flexibility because more or fewer circuit components (discrete or integrated) can readily be included within the housing of the detector. The individual components and their interconnections are all encapsulated in the plastic block 11 which also assists in directly supporting both pyroelectric detector elements. Moreover, the detector can readily be provided with more (or fewer) external conductive leads if necessary by modifying the lead frame as discussed in more detail below.

Figure 5:
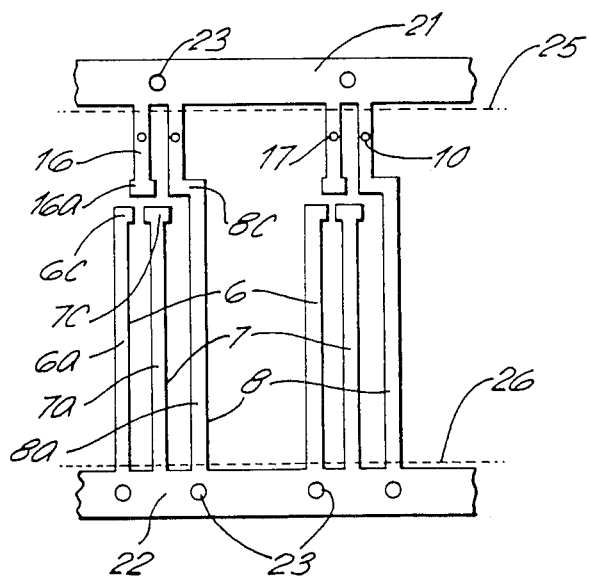
FIG. 5 is a plan view of a lead frame used in making the detector in FIGS. 1 to 3.

FIG. 5 shows part of a lead frame for use in making the detector described above. The two lead frame positions shown in FIG. 5 carry two similar groups of three leads for two detectors. A full lead frame may, for example, comprise ten such groups of leads.

It is noted here that for detectors with a different number of external leads the lead frame may have groups comprising more (or fewer) than three leads. An advantage of using a lead frame is that the same manufacturing equipment can be used with lead frames having a different number of leads per group as long as the spacing between groups is the same in each case.

In the present case, the lead frame (which may be made of 0.25 mm thick Alloy 42 available from Metalimphy S.A. in Paris, France) is formed in known manner by photoetching or stamping. The lead frame comprises two parallel rails 21 and 22 which are 3.0 mm wide and spaced apart by 23.8 mm. Holes 23 are provided in both rails 21 and 22 for indexing the lead frame along automatic assembly apparatus.

Leads 6 and 7 extend orthogonally from rail 22, and the conductive member 16 extends orthogonally from rail 21. Conductive lead 8 extends orthogonally from both rails 21 and 22 linking them to form a unitary lead frame. The dimensions and configuration of the various leads and the conductive member are substantially as described above for the detector.

Bumps 10 and 17 are formed in lead 8 and member 16, respectively, by punching dimples in the rear side of the lead frame, for example at the same time as the lead frame is stamped. The lead frame is then gold plated to a thickness of approximately 0.5 μm.

In the manufacture of the infrared radiation detector described above, the next step is to bond the chip 18 to the contact area 16a of conductive member 16 using a conductive epoxy adhesive. The wire bonds 19, 20 and 21 are then provided using conventional wire bonding techniques to connect the source, drain and diode contacts of the chip 18 to the terminal portions 6b and 7b of leads 6 and 7 and to the transverse portion 8c of lead 8, respectively as described above.

The plastic block 11 is then provided using known molding techniques to encapsulate the chip 10 and the wire bonds 20, 21 and 22. The leads 6, 7 and 8 and the conductive member 16 are also partially embedded in the block 11. The lead frame is then cropped along the broken line 25 (see FIG. 5) after which, and the pyroelectric detector elements 1 and 2 are fastened to the bumps 10 and 17 of the lead 8 and the conductive member 16 respectively using conductive epoxy adhesive. The detector elements are also secured in the recess 14 of block 11 using a nonconductive epoxy adhesive.

The cover 4, with the multilayer coated silicon window 5 already fastened in place, is then placed over to the assembly until the window 5 rests in the recess 15 of block 11. Recess 15 acts as a stop to correctly locate the cover with respect to the rest of the assembly. This facilitates accurate alignment of the window and the detector element, allowing tolerances to be reduced. Hence the size (and hence the cost) of the window can be minimized for a given field of view.

Conductive epoxy 13 is then provided in the recess 12 to electrically connect the lead 8 to the cover 4. Next the resin 9 is provided to seal the housing before the lead frame is finally cropped along the broken line 26 to complete the infrared radiation detector.

It is noted here that with the lead frame described above, a plurality of similar detectors can be made simultaneously. Until the very final stages of detector assembly the detectors are joined together in groups depending on the number of positions of the lead frame (e.g. ten in the present example). It is not until the lead frame is finally cropped along broken line 26 (as shown in FIG. 5) that the individual detectors become separated.

The particular embodiment described above is only an example and it will be evident that various modifications can be made within the scope of the invention. For example, the two series opposed detector elements may be discrete components formed from separate pyroelectric bodies. In this case, an electrical connection must be made between the two uppermost electrodes of the detector elements to connect them in series. A conductive foil strap bridging the two uppermost electrodes and fastened thereto with electrically conductive adhesive may form the connection.

Alternatively, the two detector elements may be connected in parallel opposition. In this case the detector elements may be formed from a single pyroelectric body with edge-connected electrodes as disclosed in our copending (as yet unpublished) U.K. patent application No. 8318273 (corrsponding to U.S. Pat. No. 4,556,796).

Figure 6:
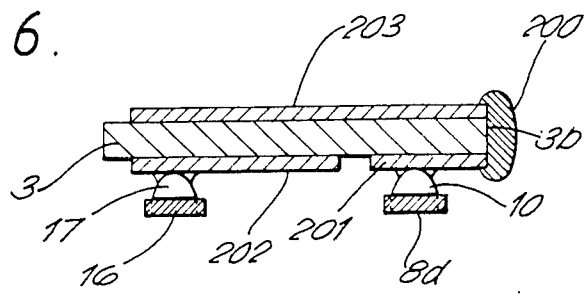
FIG. 6 is a cross section through a pyroelectric detector element of a different infrared radiation detector according to the invention.

Moreover, the detector may comprise only a single pyroelectric detector element. FIG. 6 shows a single pyroelectric detector element which is suited to replace the monolithic dual elements of the detector described above. Otherwise, the detector has the same construction and arrangement.

The pyroelectric body 3 has an electrode 203 which covers substantially the whole upper surface of the body. At least along edge 3b, electrode 203 adjoins the edge of the body. On the lower surface the pyroelectric body has a second electrode 202 which is spaced apart from the edge 3b. An electrode portion 201 on the lower surface of the pyroelectric body, but separate from electrode 202, adjoins the edge 3b and is electrically connected to electrode 203. The connection is made by means such as, for example, a blob of conducting epoxy adhesive 200 extending over the edge 3b of the pyroelectric body 3 as shown.

Electrode 202 bears against the bump 17 on the conductive member 16 and is fastened thereto with a conductive epoxy adhesive. Similarly, electrode 201 bears against the bump 10 on lead portion 8d and is fastened thereto with a conductive epoxy adhesive. Thus, conductive lead 8 is electrically connected to the upper electrode 203 and conductive member 16 is connected to the lower electrode 202. In all other respects the construction and arrangement of the single element detector may be as already described with reference to FIGS. 1 to 3.

We claim:

1. An infrared radiation detector comprising:
   a housing having a window which is transparent to infrared radiation;
   a first electrically conductive lead extending through a portion of the housing, said lead having an extended portion which is supported in the housing by the remainder of the lead; and
   a first pyroelectric detector element in the housing, said pyroelectric detector element being electrically connected to and fastened to the extended portion of the lead such that the lead supports the pyroelectric detector element in a cantilever arrangement.

2. An infrared radiation detector as claimed in claim 1, characterized in that:
   the detector further comprises a second lead extending through a portion of the housing for making an external electrical connection to the detector element; and
   the leads are flat and substantially coplanar.

3. An infrared radiation detector as claimed in claim 2, characterized in that the leads are formed from portions of a unitary frame.

4. An infrared radiation detector as claimed in claim 3, characterized in that:
   the extended portion of the first lead has a raised portion;
   the detector element is fastened to the raised portion; and
   the detector element is, for the most part, spaced from the first lead.

5. An infrared radiation detector as claimed in claim 4, characterized in that:
   the detector further comprises a block of electrically insulating material in the housing;

the leads are partially embedded in the block; and
the detector element bears against the block.

6. An infrared radiation detector as claimed in claim 5, characterized in that the block provides support for the detector element.

7. An infrared radiation detector as claimed in claim 6, characterized in that:
the detector element has first and second electrodes on one side thereof;
the first conductive lead is connected to the first electrode; and
the detector further comprises an electrically conductive member partially embedded in the block, said member being substantially coplanar with the leads, said second electrode being electrically connected to and fastened to the member such that the member supports the detector element in a cantilever arrangement.

8. An infrared radiation detector as claimed in claim 7, characterized in that:
the detector element has a third electrode on a side opposite the first and second electrodes; and
the detector further comprises connection means extending over an edge of the detector element for electrically connecting the third electrode to either the first or the second electrode.

9. An infrared radiation detector as claimed in claim 8, characterized in that:
the conductive member has a raised portion; and
the second electrode of the detector element is fastened to the raised portion of the conductive member.

10. An infrared radiation detector as claimed in claim 6, characterized in that the detector further comprises:
a second pyroelectric detector element; and
an electrically conductive member partially embedded in the block, said member being substantially coplanar with the leads, said second detector element being electrically connected to and fastened to the member such that the member supports the second detector element in a cantilever arrangement.

11. An infrared radiation detector as claimed in claim 10, characterized in that:
the conductive member has a raised portion;
the second detector element is fastened to the raised portion; and
the second detector element is, for the most part, spaced from the conductive member.

12. An infrared radiation detector as claimed in claim 11, characterized in that:
the first and second pyroelectric detector elements are formed in a common pyroelectric body;
the first detector element has a first electrode on one side of the body;
the second detector element has a second electrode on the same side of the body;
the first electrode is connected to the first conductive lead; and
the second electrode is connected to the conductive member.

13. An infrared radiation detector as claimed in claim 12, characterized in that the second detector element bears against the block.

14. An infrared radiation detector as claimed in claim 13, characterized in that the block provides support for the second detector element.

15. An infrared radiation detector as claimed in claim 14, characterized in that the conductive member is part of the unitary frame.

16. An infrared radiation detector as claimed in claim 15, characterized in that the detector further comprises at least one electrical component electrically connected to the conductive member and embedded in the block.

17. An infrared radiation detector as claimed in claim 16, characterized in that the electrical component is fastened to the conductive member.

18. An infrared radiation detector as claimed in claim 17, characterized in that the electrical component is an unencapsulated semiconductor device.

* * * * *